(12) United States Patent
Huang et al.

(10) Patent No.: US 9,397,220 B2
(45) Date of Patent: Jul. 19, 2016

(54) THIN FILM TRANSISTOR

(71) Applicant: Chunghwa Picture Tubes, LTD., Taoyuan (TW)

(72) Inventors: Chin-Hai Huang, Taoyuan County (TW); Chieh-Wei Feng, Taoyuan County (TW); Szu-Chi Huang, Changhua County (TW); Kune-Yu Lai, New Taipei (TW); Yen-Yu Huang, Taoyuan County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 66 days.

(21) Appl. No.: 14/467,040

(22) Filed: Aug. 24, 2014

(65) Prior Publication Data

US 2015/0364596 A1     Dec. 17, 2015

(30) Foreign Application Priority Data

Jun. 13, 2014   (TW) .............................. 103120573 A

(51) Int. Cl.
*H01L 29/786* (2006.01)
*G02F 1/1368* (2006.01)

(52) U.S. Cl.
CPC .......... *H01L 29/786* (2013.01); *H01L 29/7869* (2013.01); *H01L 29/78696* (2013.01)

(58) Field of Classification Search
None
See application file for complete search history.

(56) References Cited

U.S. PATENT DOCUMENTS

| 8,304,778 | B2 | 11/2012 | Wu et al. | |
|---|---|---|---|---|
| 2009/0108280 | A1* | 4/2009 | Jan et al. ........................ | 257/98 |
| 2013/0221343 | A1* | 8/2013 | Son .................... | H01L 29/78618 257/43 |
| 2015/0021572 | A1* | 1/2015 | Amari ............................ | 257/40 |

FOREIGN PATENT DOCUMENTS

TW        200952181       12/2009

OTHER PUBLICATIONS

English translation of Japanese Patent Application 2013-150413.*

* cited by examiner

*Primary Examiner* — Pamela E Perkins
(74) *Attorney, Agent, or Firm* — Jianq Chyun IP Office

(57) ABSTRACT

A thin film transistor disposed on a substrate is provided. The thin film transistor includes a channel, a gate, a source, a drain and an etching stop layer. The channel is disposed above the substrate and is located between the etching stop layer and the source. The gate is disposed on the substrate and overlapped with the channel. The source is disposed between the channel and the substrate and electrically connected to the channel. The channel is disposed between the drain and the substrate. The etching stop layer is disposed between the drain and the channel and has a first through hole exposing a portion of the channel. The drain is filled in the first through hole of the etching stop layer and is electrically connected to the channel. The drain covers the channel completely.

16 Claims, 8 Drawing Sheets

1

THIN FILM TRANSISTOR

CROSS-REFERENCE TO RELATED APPLICATION

This application claims the priority benefit of Taiwan application serial no. 103120573, filed on Jun. 13, 2014. The entirety of the above-mentioned patent application is hereby incorporated by reference herein and made a part of this specification.

BACKGROUND

1. Technical Field

The invention relates to an electronic device, and particularly relates to a thin film transistor.

2. Related Art

Along with development of technology, miniaturization of electronic elements has become a development trend. Certainly, thin film transistors are of no exception. In the conventional technique, the thin film transistor includes a gate, a source, a drain, an etching stop layer and a channel. The source and the drain belong to a same film layer, and are respectively disposed at two sides of the channel. The gate and the channel are overlapped. The etching stop layer has two through holes exposing a top surface of the channel. The source and the drain are respectively filled in the two through holes, and are electrically connected to the channel. However, configuration of the two through holes results in a fact that the channel has to maintain the area exposed by the through holes, which is of no avail for reducing the size of the thin film transistor.

Moreover, since the source and the drain respectively fill the two through holes of the etching stop layer and are electrically connected to the channel, a channel width of the thin film transistor is determined by a width of the two through holes. Limited by a processing capability of the etching stop layer, the size of the through holes of the etching stop layer is difficult to be accurately controlled, so that the channel width of the thin film transistor is not an accurate value. In this way, if a plurality of the thin film transistors are applied to a display panel, the display panel may have a problem of abnormal image display due to difference of electrical properties between the thin film transistors.

Moreover, U.S. Patent Publication No. US 2012/0097955A1 provides a thin film transistor including a gate, a gate insulation layer, a source, a channel layer and a drain. The gate insulation layer covers the gate and a substrate. The source is disposed on a portion of the gate insulation layer. The channel layer is disposed on the gate insulation layer, and covers a portion of the source located on top of the gate. The drain is disposed on the channel layer and is electrically connected to the channel layer. However, when a user uses a display panel fabricated by using the aforementioned thin film transistors under an external light, the external light may penetrate through the drain of the thin film transistor to irradiate the channel layer to produce a photo-induced leakage current that causes the problem of abnormal display of the display panel.

SUMMARY

Accordingly, the invention is directed to a thin film transistor, which has a small size and better performance.

The invention provides a thin film transistor disposed on a substrate. The thin film transistor includes a channel, a gate, a source, a drain and an etching stop layer. The channel is disposed above the substrate and is located between the etching stop layer and the source. The gate is disposed on the substrate and is overlapped with the channel. The source is disposed between the channel and the substrate and is electrically connected to the channel. The channel is disposed between the drain and the substrate. The etching stop layer is disposed between the drain and the channel and has a first through hole exposing a portion of the channel. The drain is filled in the first through hole of the etching stop layer and is electrically connected to the channel. The drain covers the channel completely.

In an embodiment of the invention, an edge of the drain exceeds an edge of the channel.

In an embodiment of the invention, a shortest distance between the drain and the channel along a normal direction of a carrying surface of the substrate is H, a shortest distance between the edge of the drain and the edge of the channel along another direction perpendicular to the normal direction is L, and $20° \leq \tan^{-1}(L/H) \leq 50°$.

In an embodiment of the invention, $30° \leq \tan^{-1}(L/H) \leq 45°$.

In an embodiment of the invention, an area of the channel is A1, an area of the drain is A2, an area of a portion of the drain going beyond the channel is (A2−A1), and $10\% \leq [(A2-A1)/A1] \leq 80\%$.

In an embodiment of the invention, the source has a contact region contacting the channel, and the drain covers the contact region of the source.

In an embodiment of the invention, an area of the channel is A1, an area of the contact region is A3, and $10\% \leq (A3/A1) \leq 50\%$.

In an embodiment of the invention, the gate exposes a portion of the channel, and the source covers the portion of the channel.

In an embodiment of the invention, a connection line direction passes through an orthogonal projection of the source on the substrate and an orthogonal projection of the first through hole on the substrate. A material of the source includes metal. The source has a first width along a first direction intersected to the connection line direction. The first through hole of the etching stop layer has a second width along a second direction parallel to the first direction, where the first width is smaller than the second width.

In an embodiment of the invention, the channel is a complete island-like pattern without a through hole. The channel has a bottom surface facing the substrate, a top surface opposite to the bottom surface and outer side surface connecting the bottom surface and the top surface. The first through hole of the etching stop layer exposes a portion of the top surface, and the etching stop layer completely covers a junction of the outer side surface and the top surface.

In an embodiment of the invention, the channel is a complete island-like pattern without a through hole. The channel has a bottom surface facing the substrate, a top surface opposite to the bottom surface and outer side surface connecting the bottom surface and the top surface. The first through hole of the etching stop layer exposes a portion of the top surface and a portion of the outer side surface directly connected to the portion of the top surface.

In an embodiment of the invention, the channel is a hollow pattern having a second through hole. The channel has a bottom surface facing the substrate, a top surface opposite to the bottom surface and an inner side surface connecting the bottom surface and the top surface and defining the second through hole. The first through hole of the etching stop layer communicates with the second through hole of the channel. The first through hole of the etching stop layer exposes the inner side surface of the channel and a portion of the top surface of the channel. The drain is filled in the first through hole of the etching stop layer and the second through hole of the channel and contacts a portion of the top surface of the channel and the inner side surface of the channel.

In an embodiment of the invention, the thin film transistor further includes an insulation layer located between the channel and the gate.

In an embodiment of the invention, the gate is located between the insulation layer and the substrate.

In an embodiment of the invention, a material of the drain includes a transparent conductive material or an opaque conductive material. If the material of the drain is the opaque conductive material, the drain covers the channel of the thin film transistor to reduce a photo-induced leakage current of the thin film transistor.

In an embodiment of the invention, a material of the channel includes metal oxide semiconductor, mono-crystalline silicon, polycrystalline silicon and amorphous silicon.

According to the above descriptions, in the thin film transistor of one embodiment of the invention, since the drain and the source are respectively disposed at the upper and lower sides of the channel, the etching stop layer is unnecessary to be configured with the through hole filling with the source as that does in the conventional technique. In other words, the number of the though holes have to be configured to the etching stop layer is decreased, which avails reducing the size of the thin film transistor. Moreover, since the drain completely covers the channel, external environment factors (such as light, etc.) are not liable to influence an electrical property of the channel, such that reliability of the thin film transistor is improved.

DETAILED DESCRIPTION OF DISCLOSED EMBODIMENTS

Figure 1A:
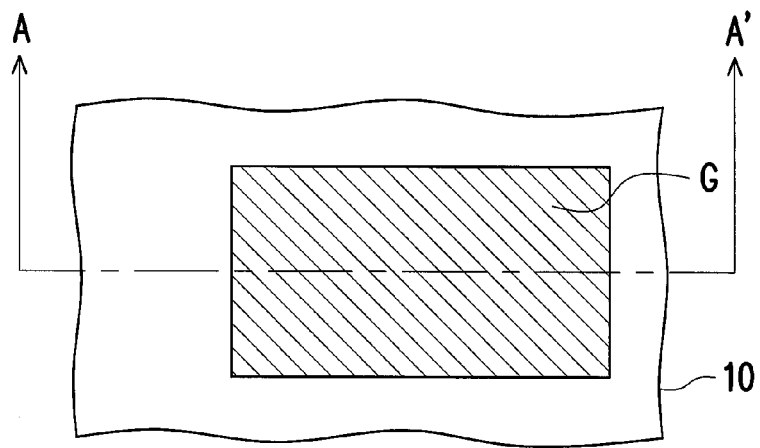
FIG. 1A to FIG. 1F are top views of a fabrication process of a thin film transistor according to an embodiment of the invention.
Figure 2A:
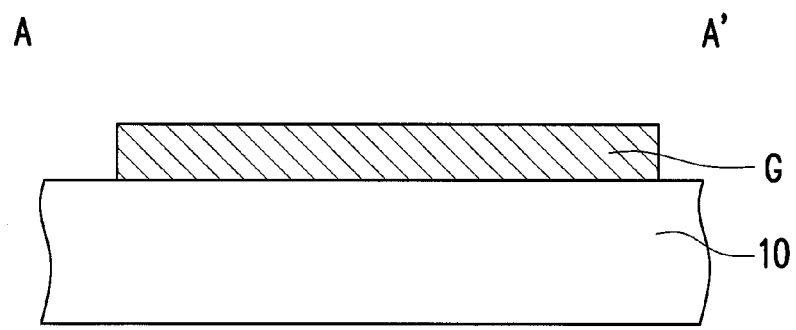
FIG. 2A to FIG. 2F are cross-sectional views of the fabrication process of the thin film transistor along a section line A-A' corresponding to FIG. 1A to FIG. 1F.

Referring to FIG. 1A and FIG. 2A, First, a substrate 10 is provided.

Regarding an optical characteristic, the substrate 10 can be a transparent substrate or an opaque/reflective substrate. A material of the transparent substrate can be glass, quartz, organic polymer, other suitable materials or a combination thereof. A material of the opaque/reflective substrate can be a conductive material, metal, wafer, ceramics, other suitable materials or a combination thereof. It should be noticed that if the substrate 10 is made of the conductive material, before components of the thin film transistor are formed on the substrate 10, an insulation layer (not shown) is first formed on the substrate 10 to avoid short circuit between the substrate 10 and the components of the thin film transistor. Regarding a mechanical characteristic, the substrate 10 can be a rigid substrate or a flexible substrate. A material of the rigid substrate can be glass, quartz, conductive material, metal, wafer, ceramics, other suitable materials or a combination thereof. A material of the flexible substrate can be ultra-thin glass, organic polymer (for example, plastic), other suitable materials or a combination thereof.

Figure 1B:
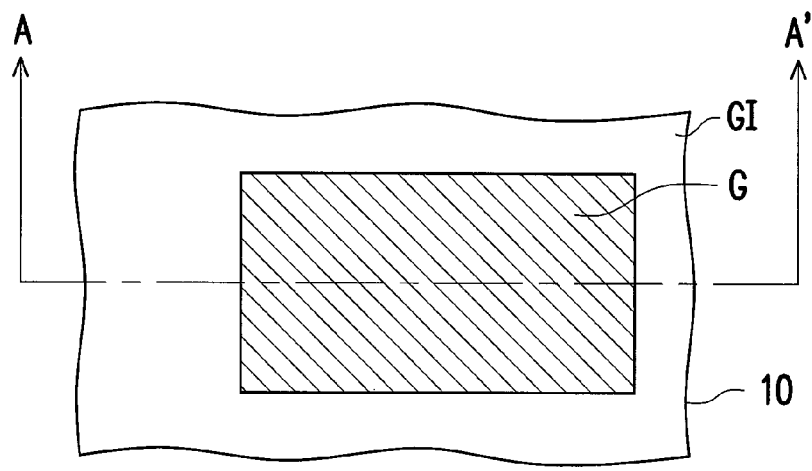
Figure 2B:
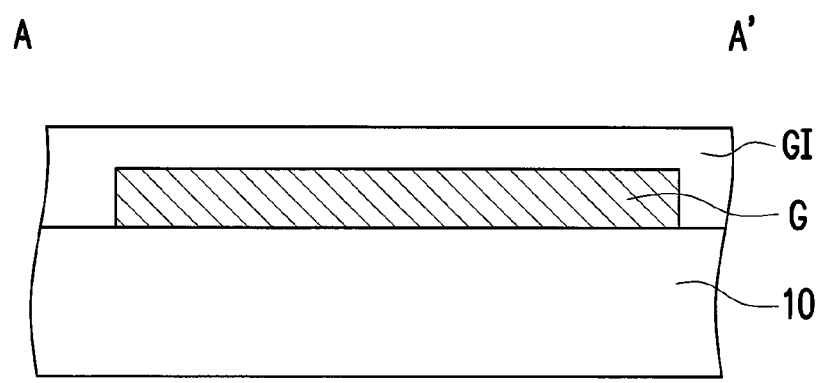

Then, a gate G is formed on the substrate 10. In the present embodiment, if the fabricated thin film transistor is to be applied to a display domain, when the gate G is formed, scan lines (not shown) electrically connected to the gate G are simultaneously formed. The gate G is generally made of a metal material. However, the invention is not limited thereto, and in other embodiments, the gate G can be made of other conductive materials, for example, alloy, nitride of a metal material, oxide of a metal material, oxynitride of a metal material or a combination thereof. Referring to FIG. 1B and FIG. 2B, an insulation layer GI is formed on the substrate 10. The insulation layer GI covers the gate G and the substrate 10. A material of the insulation layer GI can be an inorganic material (for example, silicon oxide, silicon nitride and silicon oxynitride), an organic material or a combination thereof.

Figure 1C:
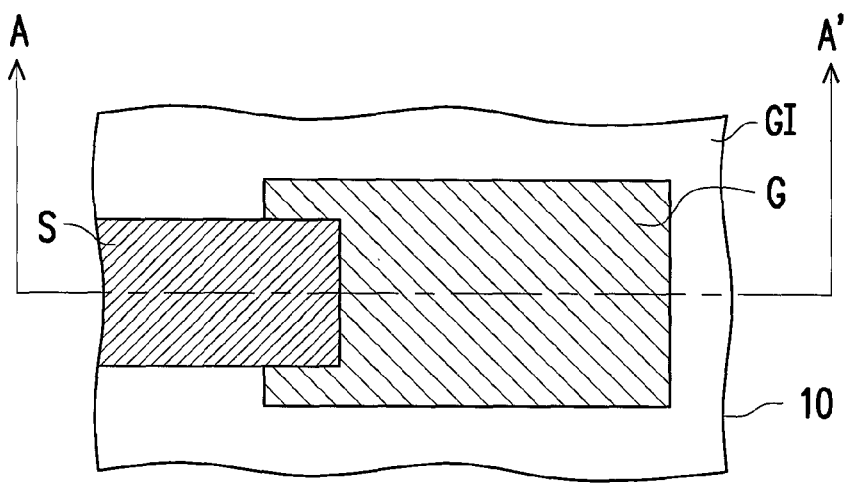
Figure 2C:
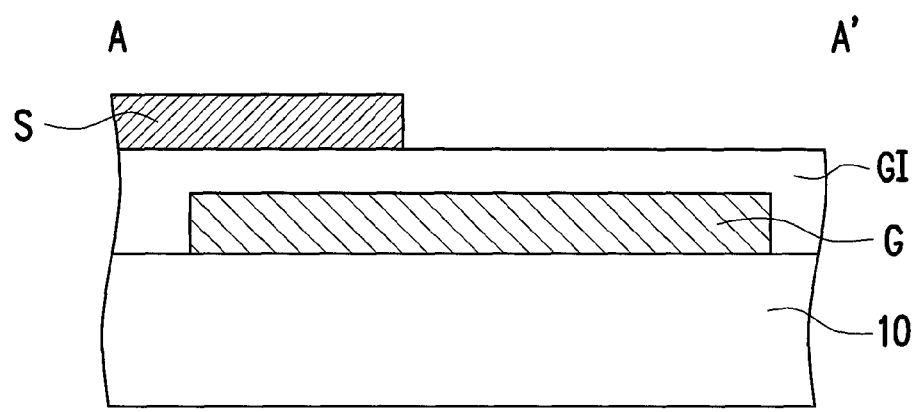

Referring to FIG. 1C and FIG. 2C, a source S is formed on the insulation layer GI. The insulation layer GI is located between the source S and the substrate 10. In the present embodiment, if the fabricated thin film transistor is to be applied to the display field, when the source S is formed, data lines (not shown) electrically connected to the source S are simultaneously formed. In the present embodiment, the source S is made of a metal material. However, the invention is not limited thereto, and in other embodiments, the source S can also be made of other conductive materials, for example, alloy, nitride of a metal material, oxide of a metal material, oxynitride of a metal material or a combination thereof.

Figure 1D:
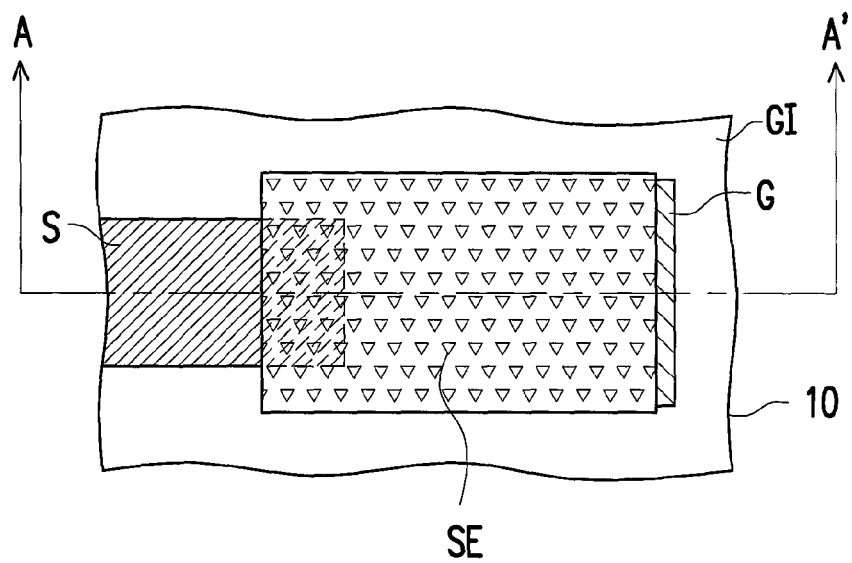
Figure 2D:
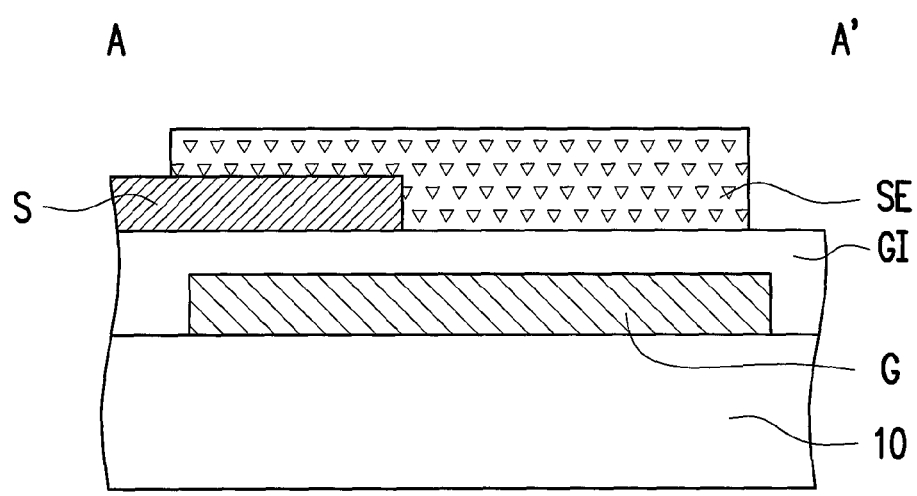

Referring to FIG. 1D and FIG. 2D, a channel SE is formed on the source S and the insulation layer GI. A portion of the channel SE may directly cover the source S and is electrically connected to the source S. In the present embodiment, the channel SE is a complete island-like pattern without a through hole. However, the invention is not limited thereto, and the channel SE may also present other suitable shapes, which is described in detail with reference of other embodiments. In the present embodiment, a material of the channel SE can be metal oxide semiconductor, for example, indium gallium zinc oxide (IGZO), zinc oxide (ZnO), indium zinc oxide (IZO), hafnium indium zinc oxide (HIZO), indium gallium oxide (IGO), cadmium oxide, germanium oxide ($2CdO \cdot GeO_2$), nickel cobalt oxide ($NiCo_2O_4$), etc., though the invention is not limited thereto, and in other embodiments, the material of the channel SE can be amorphous silicon, mono-crystalline silicon, polycrystalline silicon, or other suitable materials.

Figure 1E:
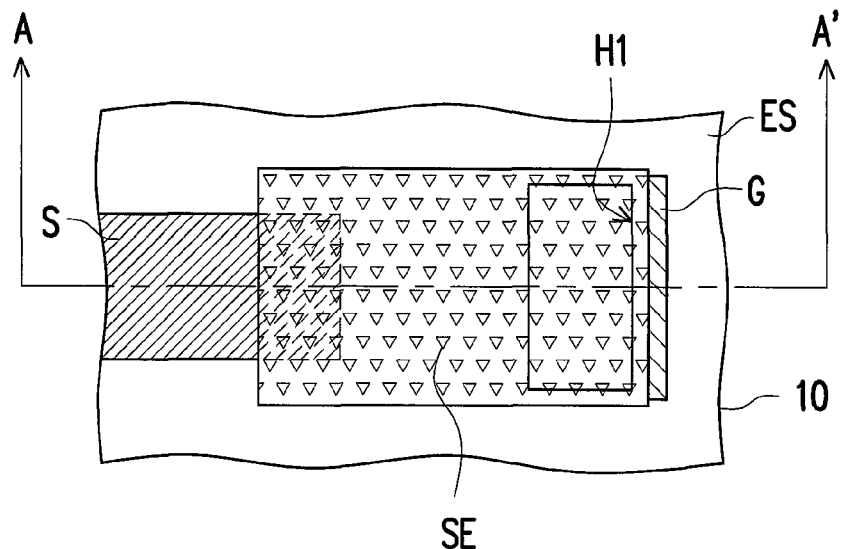
Figure 2E:
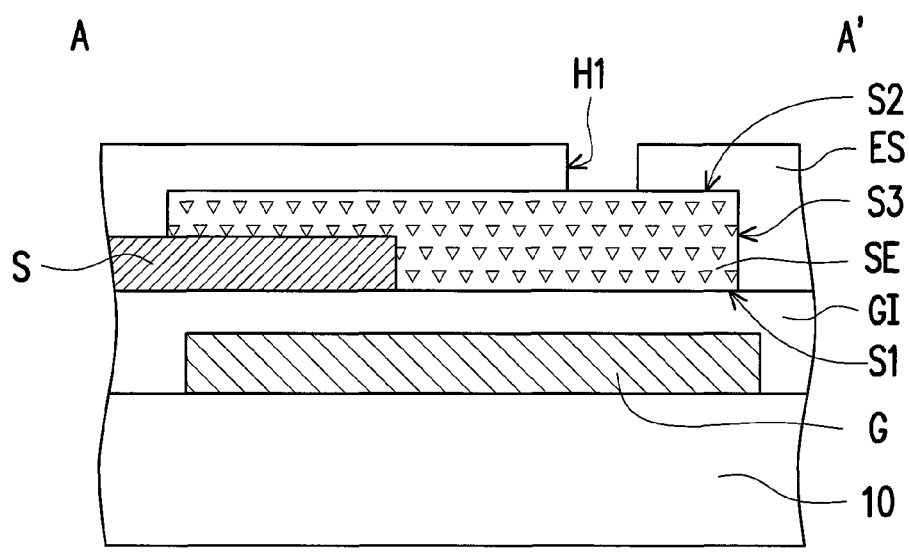

Referring to FIG. 1E and FIG. 2E, an etching stop layer ES is formed on the channel SE. The etching stop layer ES covers the source S, a portion of the channel SE contacting the source S and a portion of the insulation layer GI. The etching stop layer ES has a first through hole H1. The first through hole H1 exposes another portion of the channel SE without exposing the portion of the channel SE that contacts the source S. Further, as shown in FIG. 2E, in the present embodiment, the channel SE has a bottom surface S1 facing the substrate 10, a top surface S2 opposite to the bottom surface S1 and outer side surface S3 connecting the bottom surface S1 and the top surface S2. The first through hole H1 of the etching stop layer ES can selectively expose a portion of the top surface S2 of the channel SE, and the etching stop layer ES completely covers a junction of the outer side surface S3 and the top surface S2 (i.e. an outer edge of the channel SE). However, the invention is not limited thereto, and a relative position between the channel SE and the first through hole H1 of the etching stop layer ES may have other patterns, which are described later with reference of other embodiments.

Figure 1F:
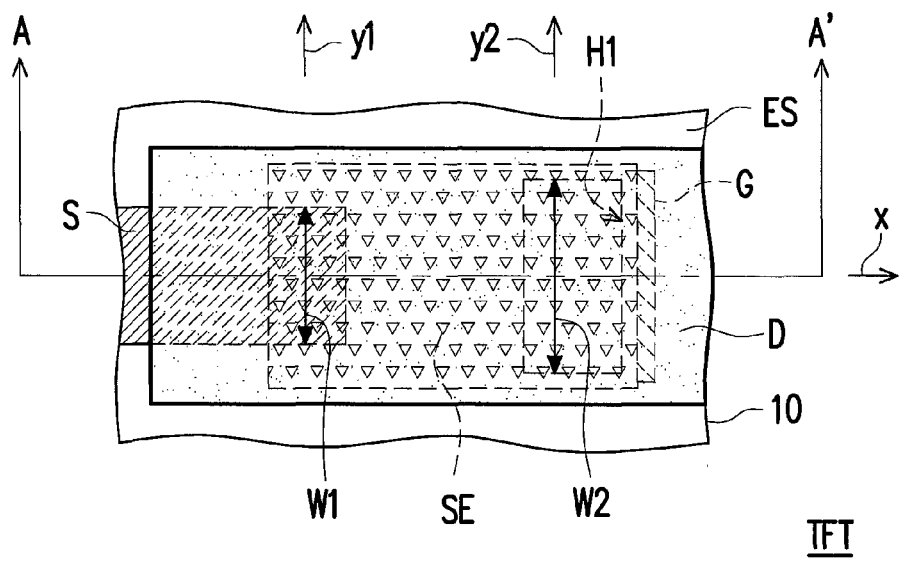
Figure 2F:
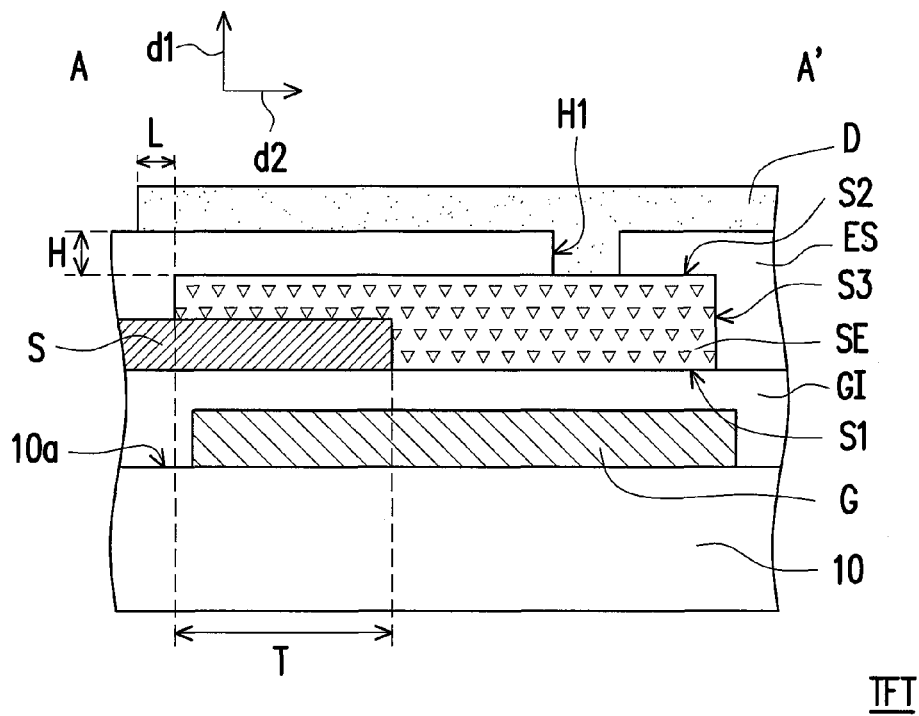

Referring to FIG. 1F and FIG. 2F, a drain D is formed. A material of the drain D can be an opaque conductive material (for example, a molybdenum tantalum alloy), a transparent conductive material (for example, indium tin oxide, indium zinc oxide, aluminium tin oxide, aluminium zinc oxide, and indium germanium zinc oxide, etc.), other suitable materials, or a combination of at least two of the above materials. The drain D is filled in the first through hole H1 of the etching stop layer ES and is electrically connected to the other portion of the channel SE. In this way, fabrication of the thin film transistor TFT is preliminarily completed.

The thin film transistor TFT of the present embodiment includes the channel SE, the gate G, the source S, the drain D and the etching stop layer ES. The channel SE is disposed on the substrate 10 and is located between the etching stop layer ES and the source S. The gate G is disposed on the substrate 10 and is overlapped with the channel SE. The source S is disposed between the channel SE and the substrate 10 and is electrically connected to the channel SE. The channel SE is disposed between the drain D and the substrate 10. The etching stop layer ES is disposed between the drain D and the channel SE and has the first through hole H1 exposing a portion of the channel SE. The drain D is filled in the first through hole H1 of the etching stop layer ES and is electrically connected to the channel SE. Particularly, the drain D completely covers the channel SE. When the drain D completely covers the channel SE, an external light is blocked by the drain D and cannot irradiate the channel SE of the thin film transistor TFT. In this way, the thin film transistor TFT is not liable to have a problem of photo-induced leakage current, so as to decrease a chance of abnormal display of the display panel applying the thin film transistor TFT.

Further, in the present embodiment, an edge of the drain D may exceed the edge of the channel SE. In detail, as shown in FIG. 2F, a shortest distance between the drain D and the channel SE along a normal direction d1 of a carrying surface 10a of the substrate 10 is H, a shortest distance between the edge of the drain D and the edge of the channel SE along another direction d2 perpendicular to the normal direction d1 is L. In order to further prevent the external light from entering the thin film transistor TFT through side incidence to irradiate the channel SE, the shortest distance H and the shortest distance L can be specifically designed. For example, $20°\leq \tan^{-1}(L/H) \leq 50°$. Particularly, $30°\leq \tan^{-1}(L/H) \leq 45°$. When the shortest distance H and the shortest distance L satisfy any of the above expressions, most of the external light incident to the thin film transistor TFT through the side edge is blocked by the drain D and is not liable to irradiate the channel SE, such that the chance of abnormal display of the display panel applying the thin film transistor TFT is further decreased.

According to another aspect, an area of the channel SE is A1, an area of the drain D is A2, and an area of a portion of the drain D going beyond the channel SE is (A2−A1), and if [(A2−A1)/A1] is designed to a specific range, the chance that the external light irradiates the channel SE of the thin film transistor TFT is further decreased. For example, $10\% \leq [(A2-A1)/A1] \leq 80\%$, though the invention is not limited thereto.

Moreover, in the present embodiment, the source S have a contact region T contacting the channel SE, and the drain D covers the contact region T of the source S. Namely, the drain D covers a transmission path of carriers in the channel SE, by which a degree that the thin film transistor TFT is influenced by the external light is effectively decreased. Further, the area of the channel SE is A1, an area of the contact region T is A3, and when $10\% \leq (A3/A1) \leq 50\%$, size reduction and electrical property of the thin film transistor TFT are both achieved.

Moreover, as shown in FIG. 2F, in the present embodiment, the gate G may expose a portion of the channel SE, and the source S covers the portion of channel SE exposed by the gate G. In other words, the gate G is designed to have a smaller area, such that layout of the other components (for example, a common electrode of the display panel applying the thin film transistor TFT) located at a same film layer with the gate G can be more flexible. On the other hand, the portion of the channel SE exposed by the gate G can be covered by the source S disposed under the channel SE. Namely, most of the channel SE can be commonly covered by the gate G and the source S. In this way, when the display panel applying the thin film transistor TFT is not a self-luminous display panel and is required to adopt a backlight source, the light emitted by the backlight source is not easy to irradiate the channel SE of the thin film transistor, so as to decrease a chance of abnormal display of the display panel.

In the present embodiment, the thin film transistor TFT further includes the insulation layer GI disposed between the channel SE and the gate G. The gate G can be selectively disposed between the insulation layer GI and the substrate 10. In other words, the thin film transistor TFT of the present embodiment can be a bottom gate thin film transistor. However, the invention is not limited thereto, and in other embodiments, the thin film transistor TFT can also be a top gate thin film transistor or other types of thin film transistor.

It should be noticed that since the drain D and the source S are respectively disposed at the upper and lower sides of the channel SE, the etching stop layer ES is unnecessary to be configured with the through hole filling with the source S as that does in the conventional technique. In other words, the number of the though holes configured to the etching stop layer ES is decreased, which avails reducing the size of the thin film transistor TFT. Moreover, since the drain D completely covers the channel SE, an admissible alignment error between the first through hole H1 of the etching stop layer ES and the channel SE and an admissible alignment error between the first through hole H1 of the etching stop layer ES and the drain D can be greater, such that the thin film transistor TFT has an advantage of easy fabrication. Meanwhile, since the drain D completely covers the channel SE, external environment factors (such as light, etc.) are not liable to influence an electrical property of the channel SE, such that reliability of the thin film transistor TFT is improved.

Referring to FIG. 1F, a connection line direction x (for example, an extending direction of the section line A-A') passes through an orthogonal projection of the source S on the substrate 10 and an orthogonal projection of the first through hole H1 of the etching stop layer ES on the substrate 10. The source S has a first width W1 along a first direction y1 intersected to the connection line direction x. In the present embodiment, the first direction y1 can be perpendicular to the connection line direction x and perpendicular to the normal direction of the surface of the substrate 10 carrying the thin film transistor TFT. The first through hole H1 of the etching stop layer ES has a second width W2 along a second direction y2 parallel to the first direction y1, where the first width W1 is smaller than the second width W2. In other words, a width (i.e. the first width W1) of the contact region of the source S and the channel SE can be smaller than a width (i.e. the second width W2) of the contact region of the drain D filling the first through hole H1 and the channel SE. Now, a width of the channel SE is determined by the first width W1 of the source S, and is not determined by the second width W2 of the first through hole H1 filling with the drain D. Since precision control of the fabrication process of the drain D is superior to precision control of the fabrication process of the first through hole H1 of the etching stop layer ES, the width of the channel SE (i.e. the first width W1 of the drain D) can be precisely controlled, which avails consistency of the electrical property of the thin film transistor TFT. Further, if a plurality of the thin film transistors TFT are formed on the substrate 10, and these thin film transistors are applied to the display panel, the display panel is not easy to have the problem of abnormal display generated due to inconsistency of the electrical properties of the thin film transistors.

Figure 3A:
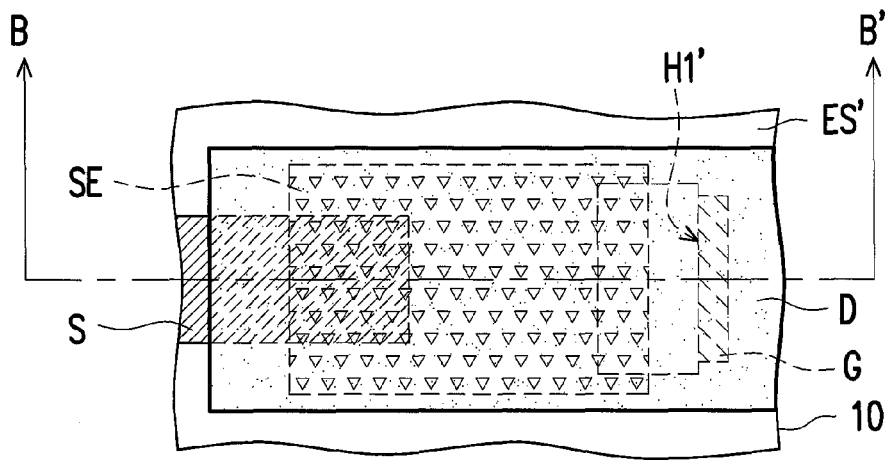
FIG. 3A is a top view of a thin film transistor according to another embodiment of the invention.
Figure 3B:
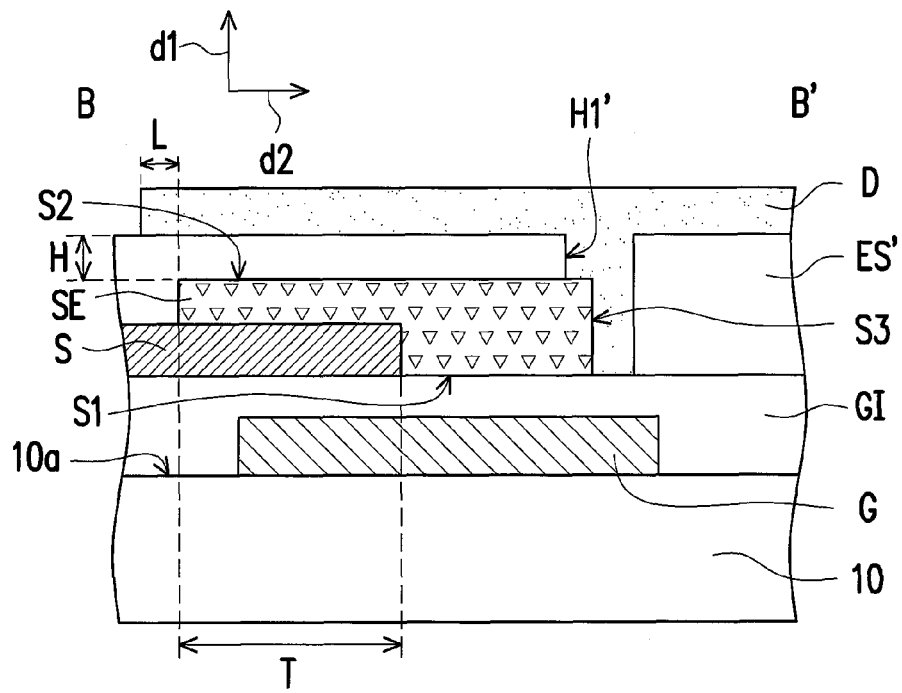
FIG. 3B is a cross-sectional view of the thin film transistor of FIG. 3A along a section line B-B'.

Referring to FIG. 3A and FIG. 3B, the thin film transistor TFT' is similar to the thin film transistor TFT of FIG. 1F and FIG. 2F, so that the same or similar components are denoted by the same of similar symbols. A main difference between the thin film transistor TFT' and the thin film transistor TFT is that a relative position between the channel SE and the first through hole H1' of the etching stop layer ES' of the thin film transistor TFT' is slightly different to the relative position between the channel SE and the first through hole H1 of the etching stop layer ES of the thin film transistor TFT. The difference between the thin film transistor TFT' and the thin film transistor TFT is described in detail below, and the same parts thereof are not repeated.

The thin film transistor TFT' includes the channel SE, the gate G, the source S, the drain D and the etching stop layer ES'. The channel SE is disposed on the substrate 10 and is located between the etching stop layer ES and the source S. The gate G is disposed on the substrate 10 and is overlapped with the channel SE. The source S is disposed between the channel SE and the substrate 10 and is electrically connected to the channel SE. The channel SE is disposed between the drain D and the substrate 10. The etching stop layer ES' is disposed between the drain D and the channel SE and has the first through hole H1' exposing a portion of the channel SE. The drain D is filled in the first through hole H1' of the etching stop layer ES', and is electrically connected to the channel SE. The drain D completely covers the channel SE.

Different to the thin film transistor TFT, as shown in FIG. 3B, the first through hole H1' of the etching stop layer ES' exposes a portion of the top surface S2 of the channel SE and a portion of the outer side surface S3 directly connected to the portion of the top surface S2. In other words, as shown in FIG. 3A, the first through hole H1' of the etching stop layer ES' exposes a portion of the outer edge of the channel SE, which is different to the situation of FIG. 1F where the etching stop layer ES completely covers the outer edge of the channel SE. In this way, when the drain D is filled in the first through hole H1' of the etching stop layer ES', the drain D contacts the portion of the outer side surface S3 of the channel SE, such that a path in the channel SE used for transmitting carriers is close to a straight line, by which the electrical property of the thin film transistor TFT' is further optimised.

Figure 4A:
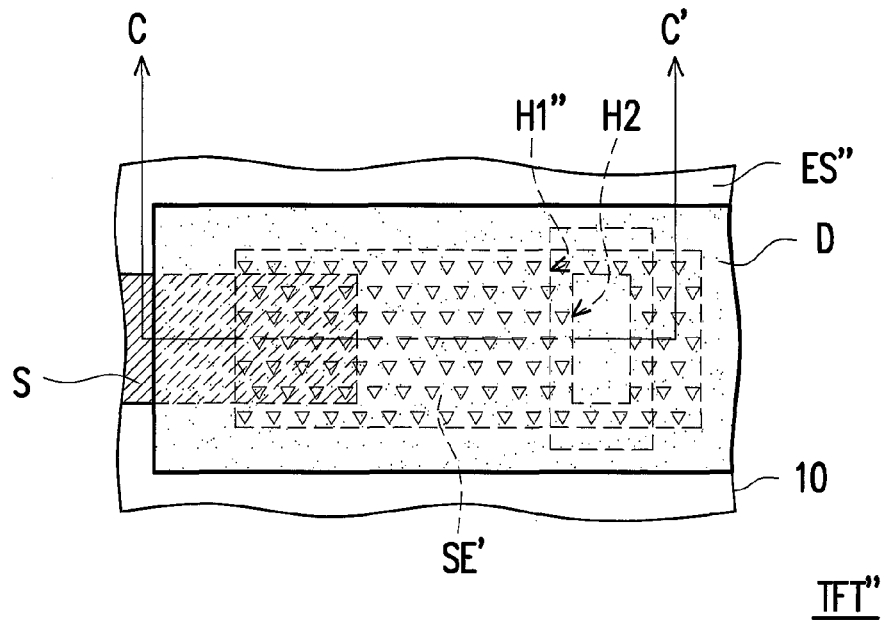
FIG. 4A is a top view of a thin film transistor according to still another embodiment of the invention.
Figure 4B:
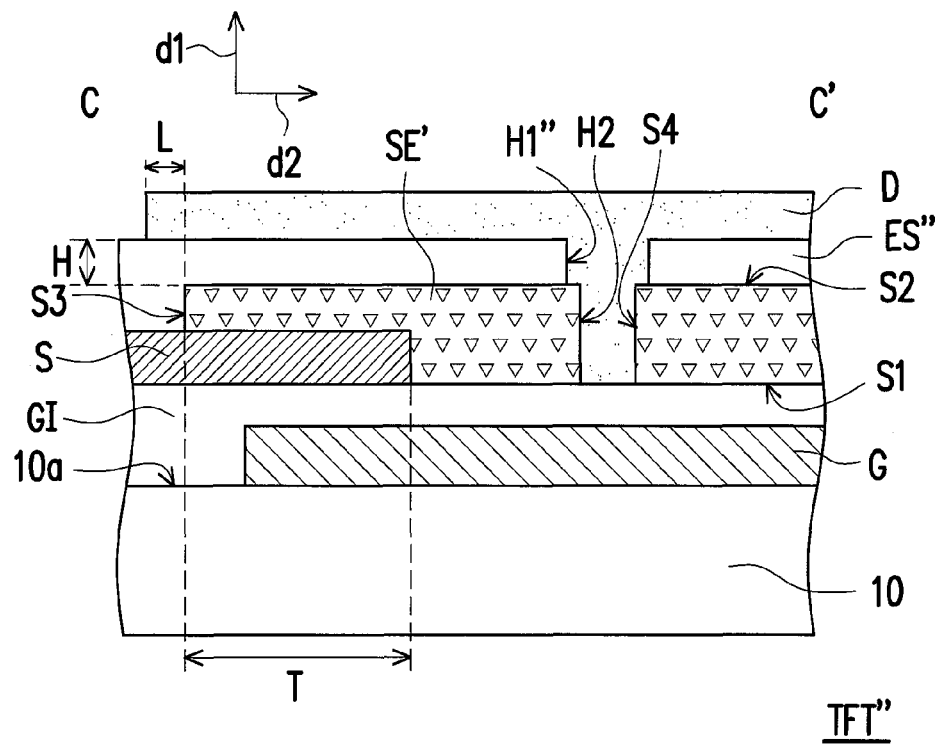
FIG. 4B is a cross-sectional view of the thin film transistor of FIG. 4A along a section line C-C'.

Referring to FIG. 4A and FIG. 4B, the thin film transistor TFT" is similar to the thin film transistor TFT of FIG. 1F and FIG. 2F, so that the same or similar components are denoted by the same of similar symbols. A main difference between the thin film transistor TFT" and the thin film transistor TFT is that a shape of the channel SE' of the thin film transistor TFT" is different to a shape of the channel SE of the thin film transistor TFT. The difference between the thin film transistor TFT" and the thin film transistor TFT is described in detail below, and the same parts thereof are not repeated.

The thin film transistor TFT" includes the channel SE', the gate G, the source S, the drain D and the etching stop layer ES". The channel SE' is disposed on the substrate 10 and is located between the etching stop layer ES and the source S. The gate G is disposed on the substrate 10 and is overlapped with the channel SE'. The source S is disposed between the channel SE' and the substrate 10 and is electrically connected to the channel SE'. The channel SE' is disposed between the drain D and the substrate 10. The etching stop layer ES" is disposed between the drain D and the channel SE' and has the first through hole H1" exposing a portion of the channel SE'. The drain D is filled in the first through hole H1" of the etching stop layer ES", and is electrically connected to the channel SE'. The drain D completely covers the channel SE'.

Different to the thin film transistor TFT, as shown in FIG. 4A, the channel SE' is a hollow pattern having a second through hole H2. As shown in FIG. 4B, the channel SE' has the bottom surface S1 facing the substrate 10, the top surface S2 opposite to the bottom surface S1, the outer side surface S3 connecting the bottom surface S1 and the top surface S2, and an inner side surface S4 surrounded by the outer side surface S3 and defining the second through hole H2. The first through hole H1" of the etching stop layer ES" communicates with the second through hole H2 of the channel SE'. Further, the first through hole H1" of the etching stop layer ES" can completely expose an edge of the second through hole H2 of the channel SE'. The first through hole H1" of the etching stop layer ES" exposes the inner side surface S4 of the channel SE' and a portion of the top surface S2 of the channel SE'. When the drain D is filled in the first through hole H1" of the etching stop layer ES" and the second through hole H2 of the channel SE', the drain D contacts the portion of the top surface S2 of the channel SE' and the inner side surface S4 of the channel SE'.

It should be noticed that through the design that the channel SE' has the second through hole H2, and the first through hole H1" of the etching stop layer ES" exposes the inner side surface of the channel SE' defined by the second through hole H2, even if the first through hole H1" of the etching stop layer ES" and the channel SE' have some alignment offset there between, a contact area between the drain D and the channel SE' is still maintained unchanged. In this way, if a plurality of the thin film transistors TFT" are formed, the electrical properties of the thin film transistors TFT" can be consistent. When these thin film transistors TFT" are applied to the display panel, the display panel is not easy to have the problem of abnormal display generated due to inconsistency of the electrical properties of the thin film transistors.

In summary, in the thin film transistor of one embodiment of the invention, since the drain and the source are respectively disposed at the upper and lower sides of the channel, the etching stop layer is unnecessary to be configured with the through hole filling with the source as that does in the conventional technique. In other words, the number of the though holes have to be configured to the etching stop layer is decreased, which avails reducing the size of the thin film transistor. Moreover, since the drain completely covers the channel, an admissible alignment error between the first through hole of the etching stop layer and the channel and an admissible alignment error between the first through hole of the etching stop layer and the drain can be greater, such that the thin film transistor has an advantage of easy fabrication. On the other hand, since the drain completely covers the channel, external environment factors (such as light, etc.) are not liable to influence an electrical property of the channel, such that reliability of the thin film transistor is improved.

What is claimed is:

1. A thin film transistor, disposed on a substrate, the thin film transistor comprising:
   a channel, disposed above the substrate;

a gate, disposed on the substrate and overlapped with the channel;

a source, disposed between the channel and the substrate and electrically connected to the channel;

a drain, disposed between the drain and the substrate; and an etching stop layer, disposed between the drain and the channel, and having a first through hole exposing a portion of the channel, wherein the drain is filled in the first through hole of the etching stop layer and is electrically connected to the channel, and the drain covers the channel completely.

2. The thin film transistor as claimed in claim 1, wherein an edge of the drain exceeds an edge of the channel.

3. The thin film transistor as claimed in claim 2, wherein a shortest distance between the drain and the channel along a normal direction of a carrying surface of the substrate is H, a shortest distance between the edge of the drain and the edge of the channel along another direction perpendicular to the normal direction is L, and $20° \leq \tan^{-1}(L/H) \leq 50°$.

4. The thin film transistor as claimed in claim 3, wherein $30° \leq \tan^{-1}(L/H) \leq 45°$.

5. The thin film transistor as claimed in claim 2, wherein an area of the channel is A1, an area of the drain is A2, an area of a portion of the drain going beyond the channel is (A2−A1), and $10\% \leq [(A2-A1)/A1] \leq 80\%$.

6. The thin film transistor as claimed in claim 1, wherein the source has a contact region contacting the channel, and the drain covers the contact region of the source.

7. The thin film transistor as claimed in claim 6, wherein an area of the channel is A1, an area of the contact region is A3, and $10\% \leq (A3/A1) \leq 50\%$.

8. The thin film transistor as claimed in claim 1, wherein the gate exposes a portion of the channel, and the source covers the portion of the channel.

9. The thin film transistor as claimed in claim 1, wherein a connection line direction passes through an orthogonal projection of the source on the substrate and an orthogonal projection of the first through hole on the substrate, the source has a first width along a first direction intersected to the connection line direction, the first through hole of the etching stop layer has a second width along a second direction parallel to the first direction, and the first width is smaller than the second width.

10. The thin film transistor as claimed in claim 1, wherein the channel is a complete island-like pattern without a through hole, the channel has a bottom surface facing the substrate, a top surface opposite to the bottom surface and an outer side surface connecting the bottom surface and the top surface, the first through hole of the etching stop layer exposes a portion of the top surface, and the etching stop layer completely covers a junction of the outer side surface and the top surface.

11. The thin film transistor as claimed in claim 1, wherein the channel is a complete island-like pattern without a through hole, the channel has a bottom surface facing the substrate, a top surface opposite to the bottom surface and an outer side surface connecting the bottom surface and the top surface, the first through hole of the etching stop layer exposes a portion of the top surface and a portion of the outer side surface directly connected to the portion of the top surface.

12. The thin film transistor as claimed in claim 1, wherein the channel is a hollow pattern having a second through hole, the channel has a bottom surface facing the substrate, a top surface opposite to the bottom surface and an inner side surface connecting the bottom surface and the top surface and defining the second through hole, the first through hole of the etching stop layer communicates with the second through hole of the channel, the first through hole of the etching stop layer exposes the er side surface of the channel and a portion of the top surface of the channel, the drain is filled in the first through hole of the etching stop layer and the second through hole of the channel and contacts a portion of the top surface of the channel and the inner side surface of the channel.

13. The thin film transistor as claimed in claim 1, further comprising:

an insulation layer, located between the channel and the gate.

14. The thin film transistor as claimed in claim 13, wherein the gate is located between the insulation layer and the substrate.

15. The thin film transistor as claimed in claim 1, wherein a material of the drain comprises a transparent conductive material or an opaque conductive material.

16. The thin film transistor as claimed in claim 1, wherein a material of the channel comprises metal oxide semiconductor, mono-crystalline silicon, polycrystalline silicon and amorphous silicon.

* * * * *